(12) United States Patent  
Bok et al.

(10) Patent No.: US 11,515,106 B2  
(45) Date of Patent: Nov. 29, 2022

(54) ELECTRONIC DEVICE HAVING KEY ASSEMBLY COMPRISING PRESSURE SENSOR, AND OPERATING METHOD THEREFOR

(71) Applicant: Samsung Electronics Co., Ltd., Gyeonggi-do (KR)

(72) Inventors: Ilgeun Bok, Gyeonggi-do (KR); Seongwon Cha, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/258,362

(22) PCT Filed: Jun. 14, 2019

(86) PCT No.: PCT/KR2019/007177  
§ 371 (c)(1),  
(2) Date: Jan. 6, 2021

(87) PCT Pub. No.: WO2020/040413  
PCT Pub. Date: Feb. 27, 2020

(65) Prior Publication Data  
US 2021/0296063 A1 Sep. 23, 2021

(30) Foreign Application Priority Data

Aug. 24, 2018 (KR) .................. 10-2018-0099178

(51) Int. Cl.  
*G06F 3/02* (2006.01)  
*H01H 13/705* (2006.01)  
(Continued)

(52) U.S. Cl.  
CPC ......... *H01H 13/705* (2013.01); *G06F 3/0216* (2013.01); *G06F 3/0238* (2013.01); *H01H 13/88* (2013.01)

(58) Field of Classification Search  
CPC .... H01H 13/705; H01H 13/88; G06F 3/0216; G06F 3/0238; G06F 3/041; G06F 3/044;  
(Continued)

(56) References Cited

U.S. PATENT DOCUMENTS 9,177,738 B2 11/2015 Park et al.  
10,014,131 B2 7/2018 Wang et al.  
(Continued)

FOREIGN PATENT DOCUMENTS

KR 1020110127557 11/2011  
KR 1020140013619 2/2014  
KR 1020140052281 5/2014

OTHER PUBLICATIONS

PCT/ISA/210 Search Report issued on PCT/KR2019/007177, dated Oct. 23, 2019, pp. 5.  
(Continued)

*Primary Examiner* — Ahmed M Saeed  
(74) *Attorney, Agent, or Firm* — The Farrell Law Firm, P.C.

(57) ABSTRACT

An electronic device according to an embodiment of the disclosure may include a housing, a key cover that penetrates at least a part of the housing and exposes at least a part of the key cover to an outside, a key button that is disposed inside the key cover and generates a pressing signal when the key button is pressed, a pressure sensor including a plurality of depressurization points between the key cover and the key button, and at least one processor electrically connected to the pressure sensor and the key button, and the at least one processor obtains a pressure signal corresponding to each of the plurality of depressurization points through the pressure sensor, obtains the pressing signal through the key button, and performs a specified operation  
(Continued)

based on the pressure signal corresponding to each of the obtained depressurization points and the pressing signal.

12 Claims, 7 Drawing Sheets

(51) Int. Cl.
*G06F 3/023* (2006.01)
*H01H 13/88* (2006.01)

(58) Field of Classification Search
CPC ............ G06F 3/046; H03K 2217/9651; H03K 17/965
See application file for complete search history.

(56) References Cited

U.S. PATENT DOCUMENTS

| | | | |
|---|---|---|---|
| 10,353,485 B1 * | 7/2019 | Zhang | .................. G06F 3/0213 |
| 2005/0052425 A1 | 3/2005 | Zadesky et al. | |
| 2007/0052691 A1 | 3/2007 | Zadesky et al. | |
| 2009/0122510 A1 | 5/2009 | Stiehl et al. | |
| 2011/0038114 A1 | 2/2011 | Pance et al. | |
| 2013/0100030 A1 * | 4/2013 | Los | ...................... G06F 3/0443 |
| | | | 345/169 |
| 2013/0341168 A1 | 12/2013 | Stiehl et al. | |
| 2014/0091857 A1 | 4/2014 | Bernstein | |
| 2014/0218853 A1 | 8/2014 | Pance et al. | |
| 2016/0049265 A1 | 2/2016 | Bernstein | |
| 2016/0155584 A1 | 6/2016 | Stiehl et al. | |
| 2016/0195955 A1 | 7/2016 | Picciotto et al. | |
| 2016/0196935 A1 | 7/2016 | Bernstein | |
| 2017/0010748 A1 | 1/2017 | Zadesky et al. | |
| 2017/0031495 A1 | 2/2017 | Smith | |
| 2017/0084406 A1 | 3/2017 | Wang et al. | |
| 2017/0147087 A1 | 5/2017 | Pance et al. | |
| 2017/0351339 A1 | 12/2017 | Kawaguchi et al. | |

OTHER PUBLICATIONS

PCT/ISA/237 Written Opinion issued on PCT/KR2019/007177, dated Oct. 23, 2019, pp. 6.

* cited by examiner

ELECTRONIC DEVICE HAVING KEY ASSEMBLY COMPRISING PRESSURE SENSOR, AND OPERATING METHOD THEREFOR

PRIORITY

This application is a National Phase Entry of PCT International Application No. PCT/KR2019/007177 which was filed on Jun. 14, 2019, and claims priority to Korean Patent Application No. 10-2018-0099178, which was filed on Aug. 24, 2018, the entire contents of each of which is incorporated herein by reference.

TECHNICAL FIELD

Embodiments of the disclosure relate to an electronic device equipped with a key assembly including a pressure sensor and a method of operating the same.

BACKGROUND ART

Electronic devices such as smart phones have physical keys for controlling power on/off and volume up/down. The electronic device is capable of receiving pressure to the physical key when the user presses the physical key, and does not provide various control methods using one physical key.

DISCLOSURE

Technical Problem

To provide various functions by using physical keys provided in the electronic device, the electronic device should include a plurality of physical keys. In this case, a design of the electronic device becomes complicated, and there is a problem that an erroneous operation occurs when a user grips the electronic device.

Embodiments of the disclosure may provide various methods to a user by using one key assembly including a plurality of depressurization points.

Technical Solution

An electronic device according to an embodiment of the disclosure may include a housing, a key cover that penetrates at least a part of the housing and exposes at least a part of the key cover to an outside, a key button that is disposed inside the key cover and generates a pressing signal when the key button is pressed, a pressure sensor including a plurality of depressurization points between the key cover and the key button, and at least one processor electrically connected to the pressure sensor and the key button, and the at least one processor obtains a pressure signal corresponding to each of the plurality of depressurization points through the pressure sensor, obtains the pressing signal through the key button, and performs a specified operation based on the pressure signal corresponding to each of the obtained depressurization points and the pressing signal.

Furthermore, a method of operating an electronic device which includes a key assembly including a pressure sensor and a key button including a plurality of depressurization points includes obtaining a pressure signal corresponding to each of the plurality of depressurization points through the pressure sensor, obtaining a pressing signal through the key button, and performing a specified operation based on the pressure signal corresponding to each of the obtained plurality of depressurization points and the pressing signal.

Advantageous Effects

According to the embodiments of the disclosure, various control methods may be provided by using one key assembly.

In addition, as the number of keys disposed in a housing of the electronic device is reduced, an abnormal manipulation may decrease, and a grip may be improved.

Furthermore, various effects that are directly or indirectly recognized through the disclosure may be provided.

DESCRIPTION OF DRAWINGS

With respect to the description of the drawings, the same or similar reference numerals may be used for the same or similar components.

MODE FOR INVENTION

Hereinafter, various embodiments of the disclosure will be described with reference to the accompanying drawings. However, this is not intended to limit the disclosure to a specific embodiment, it should be understood to include various modifications, equivalents, and/or alternatives of the embodiments of the disclosure.

Figure 1:
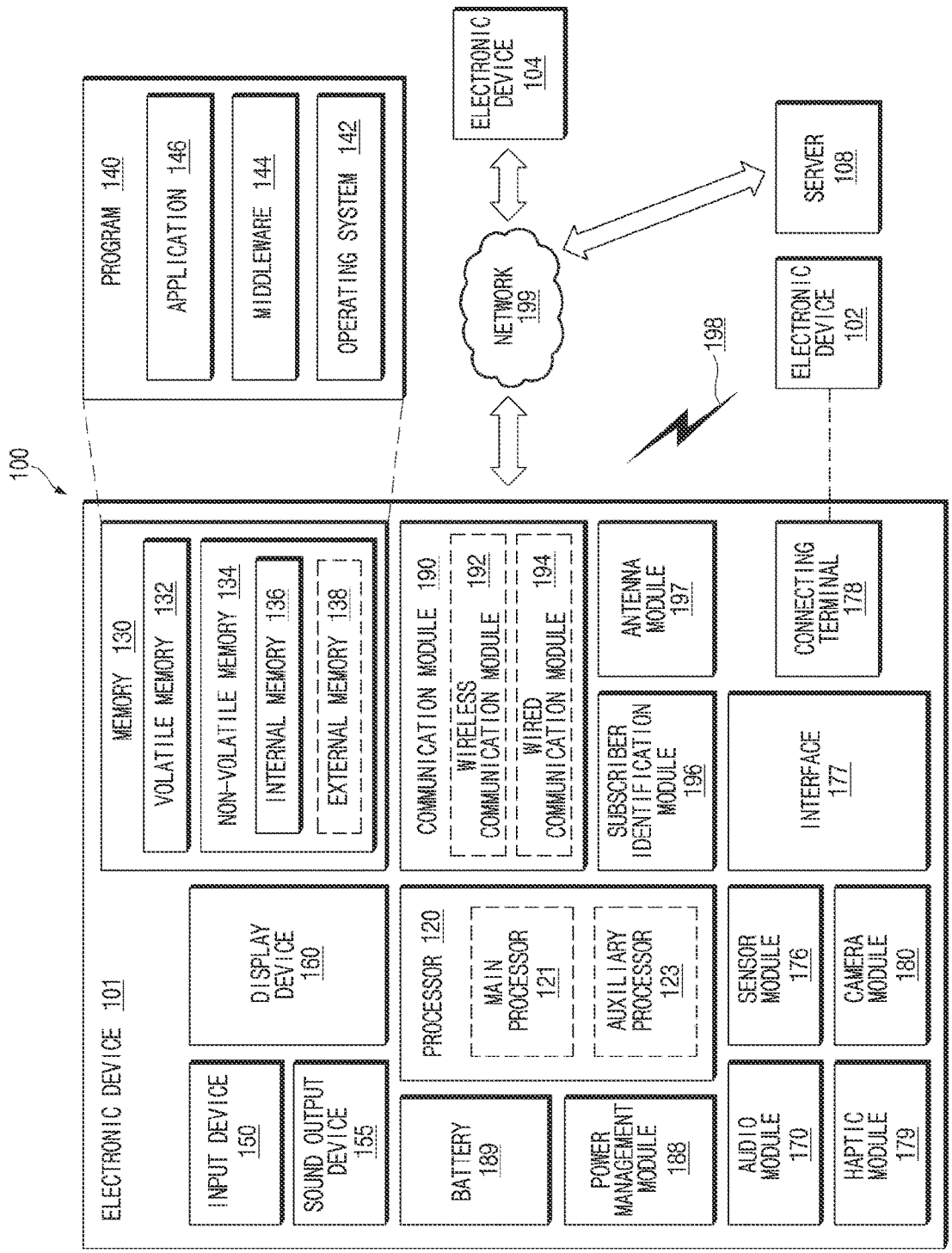
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as one component (e.g., one chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, when the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
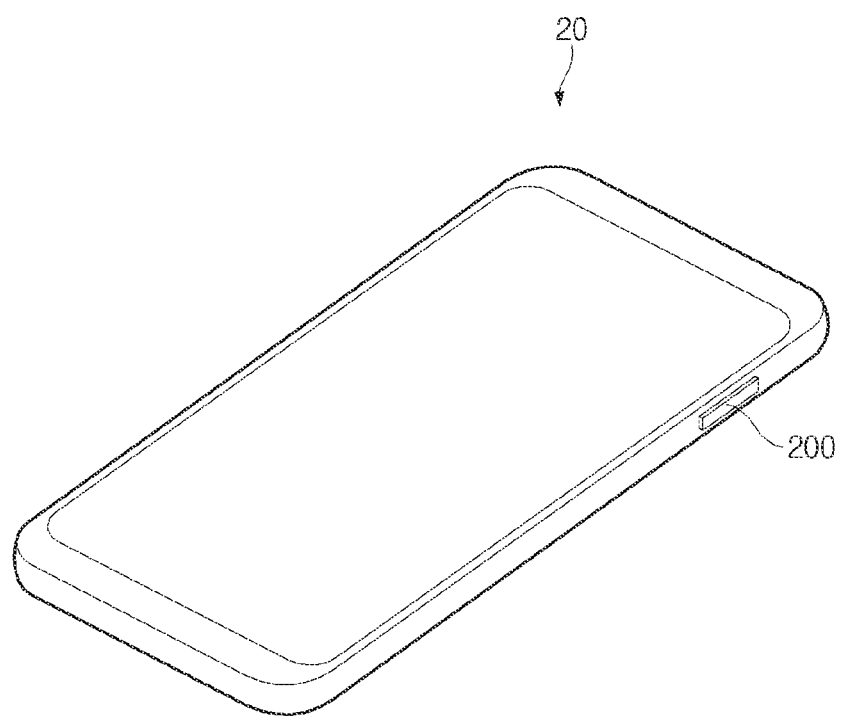
FIG. 2 illustrates an appearance of an electronic device according to an embodiment.

FIG. 2 illustrates an appearance of an electronic device according to an embodiment.

Referring to FIG. 2, an electronic device 20 may include a housing, and may include a key assembly 200 disposed in a part of the housing.

According to an embodiment, the key assembly 200 may be used to control various operations of the electronic device 20 as well as to turn on/off power of the electronic device. Hereinafter, a structure of the key assembly 200 and a method of controlling various operations of the electronic device 20 will be described.

Figure 3:
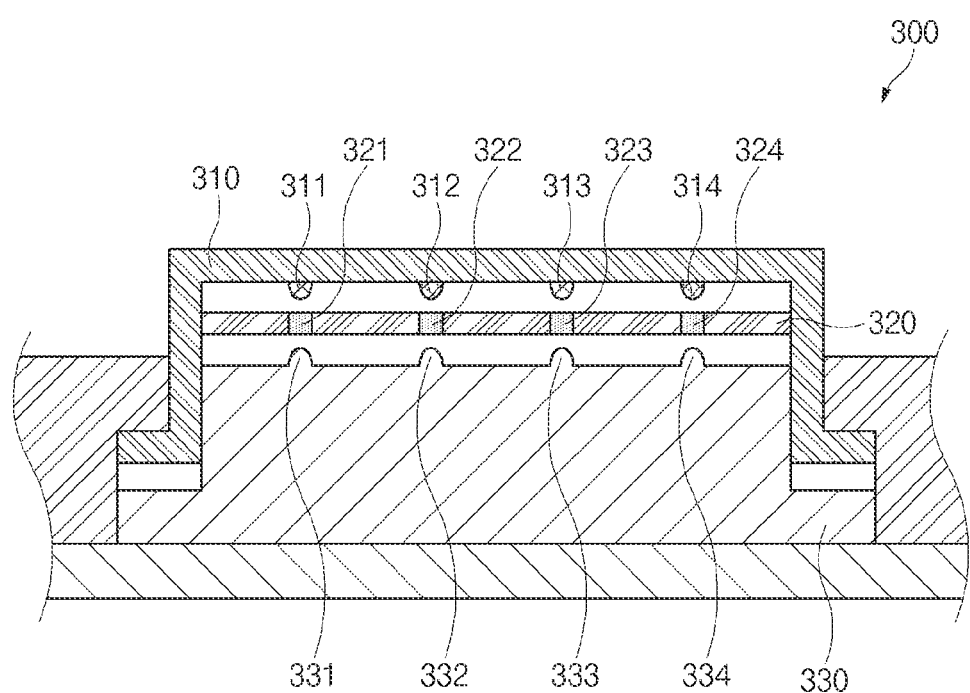
FIG. 3 is a cross-sectional view of a key assembly according to an embodiment.

FIG. 3 is a cross-sectional view of a key assembly according to an embodiment.

Referring to FIG. 3, a key assembly 300 may include a key cover 310, a pressure sensor 320, and a key button 330. The key assembly 300 of FIG. 3 may correspond to the key assembly 200 of FIG. 2.

The key cover 310 may penetrate at least a part of a housing of an electronic device such that at least a part of the key cover 310 is exposed to the outside.

According to an embodiment, the key cover 310 may include a plurality of protrusions 311 to 314 corresponding to a plurality of depressurization points 321 to 324, on a surface facing the pressure sensor 320. According to an embodiment, the plurality of protrusions 311 to 314 may be disposed inside the key cover 310 such that the key cover 310 is in contact with the depressurization points of the pressure sensor 320 when the key cover 310 is pressed downward. As the key cover 310 includes the plurality of protrusions 311 to 314, the key cover 310 may to accurately transmit a pressure by a user to the pressure sensor 320. For example, when the pressure is applied to a point where the first protrusion 311 is positioned, a part of the key cover 310 where the first protrusion 311 is positioned may bend downward. Thus, the first protrusion 311 may transmit a pressure greater than those of the second protrusion 312, the third protrusion 313, and the fourth protrusion 314, to the pressure sensor 320. A magnitude of a pressure signal generated at the first depressurization point 321 of the pressure sensor 320 may be greater than magnitudes of pressure signals generated at the second depressurization point 322, the third depressurization point 323, and the fourth depressurization point 324. As another example, when a swipe pressure from left to right of the key cover 310 is applied, the largest pressure may be sequentially applied to the first depressurization point 321, the second depressurization point 322, the third depressurization point 323, and the fourth depressurization point 324 of the pressure sensor 320.

The pressure sensor 320 may be disposed between the key cover 310 and the key button 330 and may include the plurality of depressurization points 321 to 324. The electronic device according to an embodiment may determine at which position of the key cover 310 the pressure is applied, by using the pressure signals generated from the plurality of depressurization points 321 to 324.

According to an embodiment, because the key assembly 300 uses the pressure sensor 320 instead of the touch sensor 320, even when the user wears gloves or the user's hand gets moisture, the key assembly 300 may detect a location of a user's press input.

The key button 330 may be disposed inside the key cover 310 and may generate a pressing signal by being pressed. According to an embodiment, the key button 330 may have a structure of a physical key of a general electronic device.

According to an embodiment, the key button 330 may include a plurality of protrusions 331 to 334 corresponding to the plurality of depressurization points 321 to 324 on a surface facing the pressure sensor 320. According to an embodiment, the plurality of protrusions 331 to 334 may be disposed such that the depressurization points of the pressure sensor 320 are in contact therewith when the pressure sensor 320 moves downward. As the key button 330 includes the plurality of protrusions 331 to 334 the pressure by the user to the pressure sensor 320 may be transmitted, accurately.

According to an embodiment, the key button 330 may include at least one of a pressure-responsive structure, a physical pressurization structure including a dome key, a structure detecting a change in capacitance, a structure of electromagnetic induction manner, or a structure by using selective current-carrying by a piezoelectric element.

According to an embodiment, when a pressure is applied to the key cover 310, the key cover 310 may move downward to transmit the pressure to the pressure sensor 320. The pressure sensor 320 of the key assembly 300 may generate a pressure signal corresponding to each of the plurality of depressurization points 321 to 324 depending on a pressure. The key cover 310 and the pressure sensor 320 moved downward may be in contact with the key button 330, and when the applied pressure is greater than a specific value, the key button 330 may generate a pressing signal.

Figure 4A:
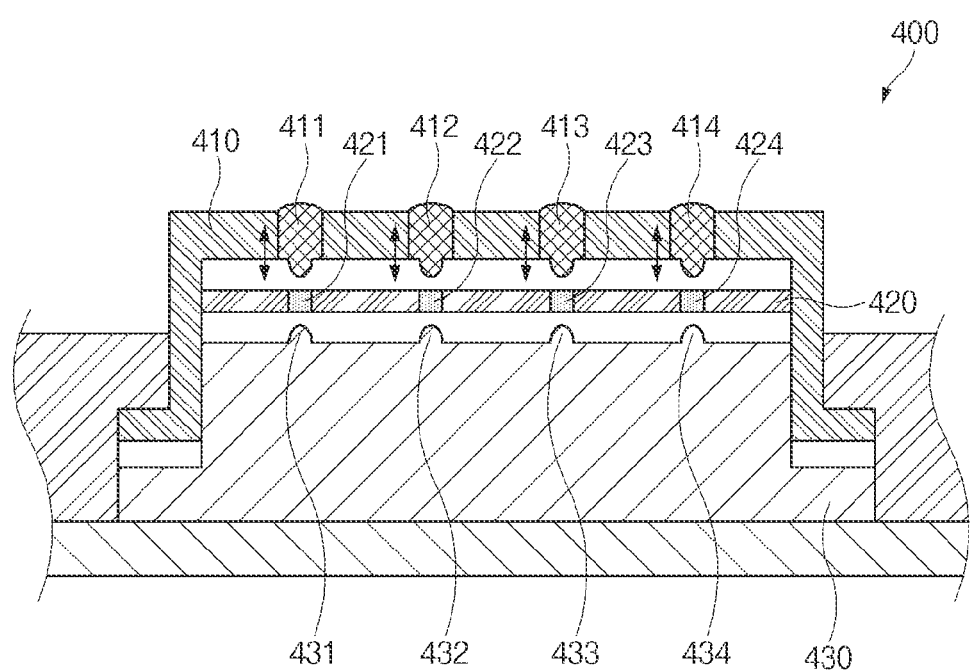
FIG. 4A is a cross-sectional view of a key assembly including moving members according to an embodiment.
Figure 4B:
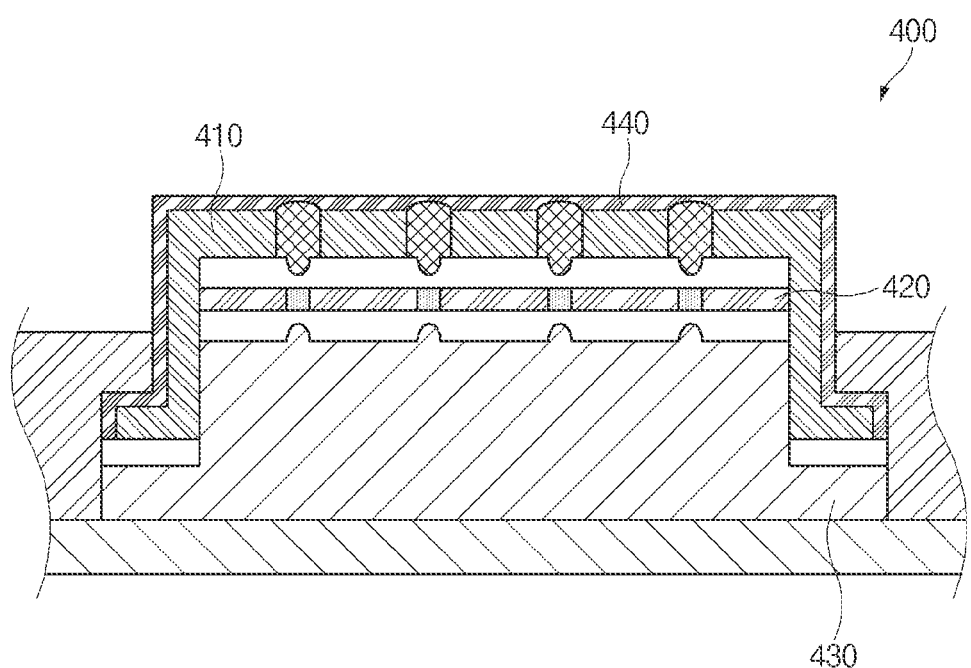
FIG. 4B is a cross-sectional view of a key assembly including a flexible member according to an embodiment.

FIG. 4A is a cross-sectional view of a key assembly including moving members according to an embodiment. FIG. 4B is a cross-sectional view of a key assembly including a flexible member according to an embodiment.

A key assembly of FIGS. 4A and 4B may correspond to the key assembly 300 of FIG. 3. Each of components 410 to 430 included in a key assembly 400 may also correspond to the components 310 to 330 included in the key assembly 300 of FIG. 3, respectively.

According to an embodiment, a key cover 410, as shown in FIG. 4A, may include a plurality of moving members 411 to 414 which penetrate a surface facing a pressure sensor and an outer surface of the key cover 410, and is capable of moving in a penetrating direction. The plurality of moving members 411 to 414 may be disposed to correspond to a plurality of depressurization points 421 to 424. Each of the plurality of moving members 411 to 414 may include protrusions corresponding to the plurality of depressurization points 421 to 424 at a part facing the pressure sensor 420.

The key cover 410 including the moving members 411 to 414 may accurately transmit the pressure applied to the key cover 410, to the pressure sensor 420. For example, when the second moving member 412 is pressed, the second moving member 412 may move downwards by a pressure and the pressure greater than those of the first moving member 411, the third moving member 413, and the fourth moving member 414 may be applied to the pressure sensor 420. Therefore, a magnitude of a pressure signal generated at the second depressurization point 422 of the pressure sensor 420 may be greater than magnitudes of pressure signals generated at the first depressurization point 421, the third depressurization point 423, and the fourth depressurization point 424.

According to an embodiment, as illustrated in FIG. 4B, the key assembly 400 may further include a flexible member 440 covering an outer surface of the key cover 410. According to an embodiment, when the key assembly 400 includes the moving members 411 to 414, the flexible member 440 may be used for waterproofing or dustproofing the key assembly 400.

Figure 5:
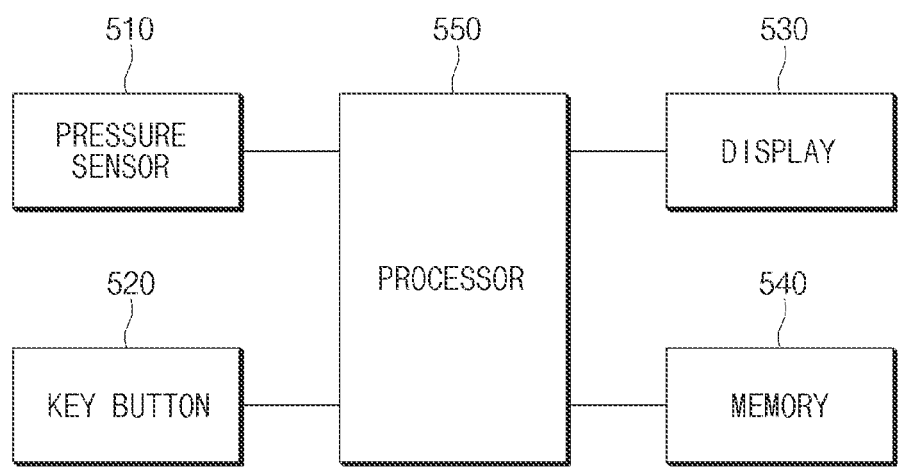
FIG. 5 is a block diagram of an electronic device according to an embodiment.

FIG. 5 is a block diagram of an electronic device according to an embodiment.

Referring to FIG. 5, an electronic device may include a pressure sensor 510, a key button 520, a display 530, a memory 540, and a processor 550.

The pressure sensor 510 may include a plurality of depressurization points and may generate a pressure signal depending on magnitudes of pressures applied to the depressurization points.

The key button 520 may generate a pressing signal when pressed.

The pressure sensor 510 of FIG. 5 may correspond to the pressure sensors 320 and 420 of FIGS. 3 to 4B, and the key button 520 may correspond to the key buttons 330 and 430 of FIGS. 3 to 4B.

The display 530 may visually provide information to the outside of the electronic device.

The memory 540 may store instructions and various data used by components of the electronic device. For example, the data may include a specified pattern formed by a pressure signal obtained through the pressure sensor 510 and information about an operation corresponding to the pattern.

The processor 550 may be electrically connected to the pressure sensor 510 and the key button 520. The processor 550 may execute the instructions stored in the memory 540 to control the overall operation of the electronic device. A specific operation of the processor 550 will be described below.

Figure 6:
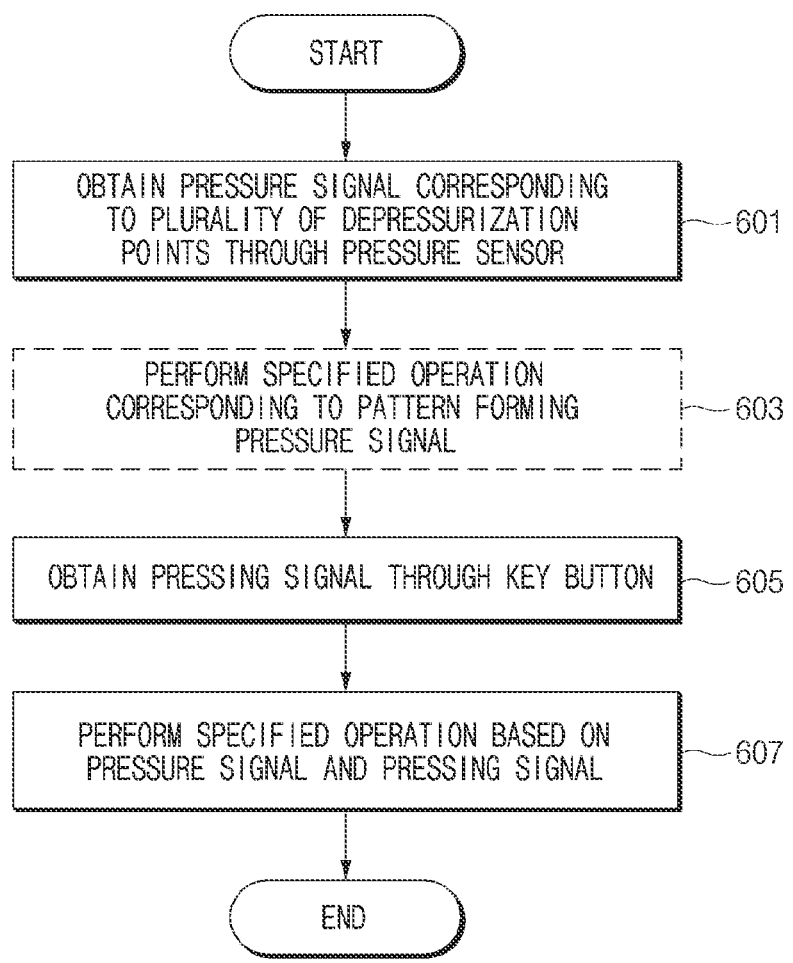
FIG. 6 is a flowchart illustrating a method of operating an electronic device by using a key assembly according to an embodiment.

Operations of the electronic device to be described with reference to FIG. 6 are assumed to be performed by the processor 550 of FIG. 5.

FIG. 6 is a flowchart illustrating a method of operating an electronic device using a key assembly according to an embodiment.

In operation 601, the processor 550 may obtain a pressure signal corresponding to each of the plurality of depressurization points through the pressure sensor 510.

According to an embodiment, the pressure may be applied to the pressure sensor 510 by pressing the above-mentioned key cover, and the pressure sensor 510 may generate the pressure signal corresponding to each of the plurality of depressurization points. The processor 550 may obtain the pressure signal generated by the pressure sensor 510.

According to an embodiment, operation 603 may be omitted. That is, although the pressure signal is obtained through the pressure sensor 510, the processor 550 may not perform a specific operation until a pressing signal is obtained.

In operation 605, the processor 550 may obtain the pressing signal through the key button 520.

According to an embodiment, the user may press the key cover, and the key cover may generate the pressing signal by pressing the key button 520

In operation 607, the processor 550 may perform a specified operation based on the pressure signal and the pressing signal corresponding to each of the obtained depressurization points.

According to an embodiment, when the pressing signal is obtained (operation 605) while the pressure signal corresponding to each of the plurality of decompression points forming the specified pattern is obtained (operation 601) through the pressure sensor 510, the processor 550 may perform a first operation. In an embodiment, when the pressing signal is obtained in a state where the pressure signal corresponding to each of the plurality of decompression points forming the specified pattern is not obtained, the processor 550 may perform a second operation different from the first operation. For example, when the pressing signal is obtained while the pressure signal corresponding to each of the plurality of decompression points forming the specified pattern is obtained, the processor 550 may execute a specified application (e.g., a camera application). In addition, when the pressing signal is obtained in a state where the pressure signal corresponding to each of the plurality of decompression points forming the specified pattern is obtained, the processor 550 may perform an operation of turning off the display 530.

According to an embodiment, the specified pattern may include at least one of a first pattern in which magnitudes of pressure signals corresponding to the plurality of depressurization points are sequentially equal to or higher than a first threshold, a second pattern in which a pressure signal equal to or higher than a second threshold is obtained multiple times within a first time, or a third pattern in which a pressure signal equal to or higher than a third threshold is maintained for a second time. The first pattern may correspond to an input of the user swiping the key cover in a direction in which the depressurization points are arranged. The second pattern may correspond to an input in which the user taps the key cover twice or more within a short time. The third pattern may correspond to a long tap input in which the user presses the key cover for a specific time or longer.

According to an embodiment, the third threshold may be greater than the first threshold and the second threshold. The long tap input may occur due to abnormal manipulation contrary to the user's intention. In contrast, the swipe input or double tap input has a lower probability of abnormal manipulation than the long tap input. Therefore, when the third threshold is set to be higher than the first threshold and the second threshold, an operation due to a malfunction may not be performed.

According to an embodiment, the specified pattern may include a combination of at least two of the first pattern, the second pattern, and the third pattern.

For example, a pattern in which the first pattern and the third pattern are combined may correspond to a state in which the user continuously presses the key cover without releasing his or her hand after the swipe input.

In the case where operation 603 is omitted as described above, when the pressing signal is not obtained in a state where the pressure signal corresponding to each of the plurality of decompression points forming the specified pattern is obtained through the pressure sensor 510, the processor 550 may not perform a specific operation. However, when operation 603 is not omitted, the processor 550 may perform an operation corresponding to the specified pattern when the pressure signal corresponding to each of the plurality of decompression points forming the specified pattern is obtained through the pressure sensor 510.

The specified pattern may include at least one of the first pattern in which the magnitudes of the pressure signals corresponding to the plurality of depressurization points are sequentially equal to or higher than the first threshold, the second pattern in which the pressure signal equal to or higher than the second threshold is obtained multiple times within the first time, or the third pattern in which the pressure signal equal to or higher than the third threshold is maintained for the second time.

For example, an operation corresponding to the first pattern may include at least one of adjusting a volume of sound output from the electronic device, switching a camera mode of the electronic device, adjusting a camera zoom of the electronic device, adjusting a brightness of the display 530 of the electronic device, or scrolling a screen of the electronic device. When the pressure signal forming the second pattern is obtained, the processor 550 may turn off the display 530. When the pressure signal forming the third pattern is obtained, the processor 550 may execute a specified application.

According to an embodiment, the specified pattern may include a combination of at least two of the first pattern, the second pattern, and the third pattern. According to an embodiment, when a pressure signal forming a combination pattern is obtained, the processor 550 may continuously perform an operation corresponding to the first pattern. For example, when the operation corresponding to the first pattern is an operation of decreasing the volume of sound, the processor 550 may continuously reduce the volume of the sound while the swipe input is not generated, and the long tap input is continued. In addition to the above-described example, the second pattern and the third pattern may also be combined, and an operation corresponding to the combined pattern may be an operation of executing a specified application.

According to an embodiment, when the pressure signal corresponding to each of the plurality of depressurization points forming the specified pattern is obtained through the pressure sensor 510 (operation 601), the processor 550 may perform a first operation corresponding to a specified pattern (operation 603), and when the pressing signal is obtained (operation 605) while the pressure signal corresponding to each of the plurality of depressurization points forming the specified pattern is obtained, the processor 550 may perform a second operation (operation 607). Furthermore, when the pressing signal is obtained in a state where the pressure signal corresponding to each of the plurality of depressurization points forming the specified pattern is not obtained, a third operation different from the second operation may be performed.

For example, while a camera application is executed, in a case where a pressure signal forming a first pattern is obtained as a swipe input to the key cover (operation 601), the processor 550 may perform a zoom-in/zoom-out operation (first operation) of the camera in a swipe direction (operation 603). When a pressing signal is obtained as an input corresponding to a press of the key button 520 is received during the swipe input to obtain a pressing signal (operation 605), the processor 550 may perform a photographing operation (second operation) (operation 607). In an embodiment, when a pressure signal forming the first pattern is not obtained because the swipe input is not received, and an input of pressing the key button 520 is received, the processor 550 may perform an operation of turning off the display 530 (third operation).

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that when an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be one integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. When distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include one entity or multiple entities. According to various embodiments, one or more of the above-described components may be omitted, or one or more other components may be added. Alternatively or additionally, a plurality of components (e.g., modules or programs) may be integrated into one component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a key button;
a pressure sensor disposed on the key button;
a key cover configured to cover;
the key button is pressed;
the key button and the pressure sensor; and
at least one processor electrically connected to the pressure sensor and the key button,
wherein the key button includes a first protrusion group,
wherein the pressure sensor includes a plurality of pressure sensing points disposed to correspond to the first protrusion group,
wherein the key cover includes a second protrusion group disposed to correspond to the plurality of pressure sensing points, and
wherein the at least one processor is configured to:
obtain a pressure signal corresponding to each of the plurality of pressure sensing points through the pressure sensor,
obtain a pressing signal through the key button, and
perform a specified operation based on the pressure signal and the pressing signal.

2. The electronic device of claim 1, wherein the key cover includes a plurality of moving members penetrating a surface facing the pressure sensor and an outer surface of the key cover and movable in a penetrating direction, and
wherein the plurality of moving members are disposed to correspond to the plurality of pressure sensing points, respectively.

3. The electronic device of claim 2, wherein each of the plurality of moving members includes a protrusion corresponding to each of the plurality of pressure sensing points at a part facing the pressure sensor.

4. The electronic device of claim 2, further comprising:
a flexible member covering the outer surface of the key cover.

5. The electronic device of claim 1, wherein the key button includes at least one of a pressure-responsive structure, a physical pressurization structure including a dome key, a structure detecting a change in capacitance, a structure of electromagnetic induction manner, or a structure using selective current-carrying by a piezoelectric element.

6. The electronic device of claim 1, wherein the at least one processor is configured to:

perform a first operation when the pressing signal is obtained while the pressure signal corresponding to each of the plurality of pressure sensing points forming a specified pattern is obtained through the pressure sensor, and perform a second operation different from the first operation when the pressure signal corresponding to each of the plurality of pressure sensing points forming the specified pattern is not obtained and the pressing signal is obtained.

7. The electronic device of claim 1, wherein the at least one processor is configured to perform an operation corresponding to a specified pattern when the pressure signal corresponding to each of the plurality of pressure sensing points forming the specified pattern is obtained through the pressure sensor.

8. The electronic device of claim 7, wherein the specified pattern includes at least one of a first pattern in which magnitudes of pressure signals corresponding to the plurality of pressure sensing points are sequentially equal to or higher than a first threshold, a second pattern in which a pressure signal equal to or higher than a second threshold is obtained multiple times within a first time, or a third pattern in which a pressure signal equal to or higher than a third threshold is maintained for a second time.

9. The electronic device of claim 8, wherein the specified pattern includes a combination of at least two of the first pattern, the second pattern, and the third pattern.

10. The electronic device of claim 8, wherein the third threshold is greater than the first threshold and the second threshold.

11. The electronic device of claim 8, wherein an operation corresponding to the first pattern includes at least one of adjusting a volume of sound output from the electronic device, switching a camera mode of the electronic device, adjusting a camera zoom of the electronic device, adjusting a brightness of a display of the electronic device, or scrolling a screen of the electronic device.

12. The electronic device of claim 1, wherein the at least one processor is configured to:

perform a first operation corresponding to a specified pattern when the pressure signal corresponding to each of the plurality of pressure sensing points forming the specified pattern is obtained through the pressure sensor;

perform a second operation when the pressing signal is obtained while the pressure signal corresponding to each of the plurality of pressure sensing points forming the specified pattern is obtained; and perform a third operation different from the second operation when the pressure signal corresponding to each of the plurality of pressure sensing points forming the specified pattern is not obtained and the pressing signal is obtained.

\* \* \* \* \*